(12) United States Patent
Chauhan et al.

(10) Patent No.: US 6,979,831 B2
(45) Date of Patent: Dec. 27, 2005

(54) METHOD AND APPARATUS FOR A FORMATTER FOLLOWING ELECTRON BEAM SUBSTRATE PROCESSING SYSTEM

(75) Inventors: Sundeep Chauhan, Edina, MN (US);
Lawrence Bryant, Palo Alto, CA (US);
Neil Deeman, Alamo, CA (US);
Christopher Formato, Brentwood, CA (US); David Kuo, Palo Alto, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 99 days.

(21) Appl. No.: 10/783,584

(22) Filed: Feb. 19, 2004

(65) Prior Publication Data

US 2005/0184256 A1    Aug. 25, 2005

(51) Int. Cl.[7] .......................... H01J 37/00; G11B 5/596
(52) U.S. Cl. .............................. 250/492.1; 250/440.11; 250/441.11; 250/442.11
(58) Field of Search ...................... 250/440.11, 441.11, 250/442.11

(56) References Cited

U.S. PATENT DOCUMENTS

| | | | |
|---|---|---|---|
| 3,956,635 A * | 5/1976 | Chang | ...................... 250/492.2 |
| 4,820,928 A * | 4/1989 | Ooyama et al. | .......... 250/492.2 |
| 5,136,169 A * | 8/1992 | Smith et al. | .............. 250/491.1 |
| 5,148,322 A * | 9/1992 | Aoyama et al. | ............. 359/708 |
| 6,204,989 B1 | 3/2001 | Hrinya et al. | |
| 6,262,429 B1 * | 7/2001 | Rishton et al. | ......... 250/492.23 |
| 6,393,604 B1 * | 5/2002 | Yamada et al. | ................ 716/21 |
| 6,500,497 B1 * | 12/2002 | Wang et al. | ................. 427/528 |

* cited by examiner

Primary Examiner—John R. Lee
Assistant Examiner—David A. Vanore

(57) ABSTRACT

Embodiments of the invention generally provide an electron beam substrate processing system. In one embodiment, the present invention provides an electron beam substrate processing system where a spindle shaft used to rotate substrates during processing includes at least one optical encoder wheel assembly. The optical encoder wheel assembly is configured to provide rotational speed data signal to a rotational speed control system and a pattern generation clock circuit configured to a provide a corrected pattern generator clock signal to a pattern generator circuit. The pattern generation circuit is used to control modulation of an electron beam used for substrate processing. In one aspect of the present invention, repeatable deviations of the rotational speed are measured and processed during substrate processing to correct for such repeatable deviations to increase substrate pattern writing accuracy.

20 Claims, 5 Drawing Sheets

METHOD AND APPARATUS FOR A FORMATTER FOLLOWING ELECTRON BEAM SUBSTRATE PROCESSING SYSTEM

BACKGROUND OF THE INVENTION

1. Field of the Invention

The invention relates generally to processing substrates with electron beams. More particularly, the present invention relates to applying electron beams to surfaces of substrates to write patterns thereon.

2. Description of the Related Art

In electron beam substrate processing systems, a narrowly converged electron beam is applied to target positions on the surface of substrates to form patterns thereon. Electron beam substrate processing systems generally include an electron gun, electromagnetic lens, and a vacuum chamber for holding the specimen substrate. Electron beam substrate processing systems write a desired pattern on a substrate surface usually coated with electron beam resist by focusing, directing, and blanking the electron beam such that only specified surface areas of the substrate are processed.

Processing substrates generally involves raster-scan and vector-scan processes. According to the raster-scan process, a rectangular region of the substrate, also referred to as a field, is sequentially and fully scanned at the same speed, one end to the other, before moving to the next field. The electron beam is applied to the region of the field where a pattern is to be written and blocked, from other regions by a blanking mechanism. According to the vector-scanning process, an electron beam skips areas where no graphic pattern is to be written, and is deflected only to a substrate surface area where a pattern is to be written.

Substrates are often processed with electron beam processing systems where the substrate is placed on a movable electronic chuck within a vacuum-processing chamber. Such electron beam assemblies usually include a load lock chamber and transfer robot to hold and transfer the substrates onto the electronic chuck for processing. To position the substrate within a preferred radius of the electron beam the electronic chuck and substrate thereon are moved in a horizontal X and Y direction. Once in a desired position the electron beam may be deflected to more accurately position the electron beam onto the substrate.

Substrates may be processed using rotating electron beam substrate processing systems. Rotating electron beam substrate processing systems rotate substrates underneath a narrowly focused electron beam that may also use deflection to accurately position the electron beam on the substrate surface. Similar to the non-rotating electron beam systems, blanking control is generally used to correctly apply the electron beam to a surface region of the rotating substrate surface.

In rotating electron beam substrate processing systems, a substrate is mounted on a rotating spindle shaft assembly. The rotating spindle shaft assembly is coupled to a spindle motor that provides rotational speed to the spindle shaft and therefore the specimen substrate. The rotational velocity and acceleration of the spindle is generally controlled by a controller in communication with the spindle motor. The spindle assembly is generally configured to move in a radial direction relative to an electron beam discharge assembly, i.e., electron gun, to allow the electron beam to be precisely positioned on desired surfaces of the rotating substrate. As the substrate is rotated and moved, the electron beam is deflected as needed and applied to the desired regions of the substrate using a blanking control. To correctly apply the proper pattern to the substrate being processed, a pattern clock may be used. Conventionally, the pattern clock is associated with the spindle rotational speed and position of the spindle relative the electron beam such that at calculated times based on the angular rotation and movement of the substrate, a pattern region will be positioned within a radius of the electron beam for processing.

Generally, an optical encoder is used in the control of the rotation of the spindle. The optical encoder generally includes an optical reader positioned to read an optical encoder disk. Conventionally, to mechanically couple the optical encoder disk to the substrate, the optical encoder disk is mounted on an end of the spindle shaft distal the substrate. As the spindle motor rotates, the optical reader detects timing marks on the optical disk to determine the speed of rotation. To maximize resolution, the timing marks are usually placed on the outer edge of the encoder disk or a larger diameter encoder disk is used. The detected timing marks generally provide a rotational velocity signal used as a rotation control signal. A master clock is used to generate a pattern clock signal for a pattern generation circuit. The rotation of the spindle motor is phase locked to the master clock such that the rotation of the spindle motor is adjusted until rotation control signal is in phase with the master clock. The pattern clock signal is used by the pattern generation circuit to control a blanking mechanism of the rotating electron beam substrate processing system to control the on and off time of the electron beam.

Generally, structural resonance, structural imbalances, bending modes, bearing friction, and the like, contribute to deviations from a desired rotational velocity and pattern placement position during substrate processing. Further, due to the positional distance between the optical encoder disk and the substrate, and torsion on the spindle shaft under rapid acceleration changes, the instantaneous rotational velocity of the optical encoder and substrate may differ which contributes to such deviations. Unfortunately, such deviations adversely affect the timing accuracy of pattern writing signals processed by the electron beam assembly. Accordingly, the electron beam assembly generates misaligned patterns on the substrate surface associated with such deviations. Therefore, such deviations contribute to pattern placement errors, e.g., track-to-track phase error of written patterns.

Therefore, a need exists for a method and apparatus to minimize misalignment errors between an electron beam and the substrate pattern target.

SUMMARY OF THE INVENTION

An aspect of the present invention is an electron beam substrate processing system. The system includes a substrate processing chamber defined by sidewalls, a bottom, and a top. A spindle motor assembly moveably disposed within the substrate processing chamber. A spindle shaft extending from the spindle motor assembly toward the top. A substrate support member mounted to an end of the spindle shaft distal the spindle motor assembly. An encoder wheel coupled to the spindle shaft is positioned adjacent the substrate support member. An optical detector is positioned in optical communication with the encoder wheel. The optical detector being configured to output rotation data signals in response to detected rotation of the encoder wheel. The system further includes a controller configured to output corrected pattern clock signals in response to the rotation data signals. The system includes an electron beam assembly attached to the substrate processing chamber and configured to direct an electron beam onto a surface of the substrate for processing.

An aspect of the present invention is a method of processing substrates with an electron beam processing system. The method includes rotating a substrate support member configured to hold the substrate thereon for processing. The method includes generating rotation data signals from an encoder assembly associated with a rotational movement of the substrate support member and generating corrected pattern clock signals from the rotation data signals associated with the rotational movement of the substrate support member. The method further includes processing at least some of the corrected pattern clock signals to generate a corrected electron beam processing pattern for writing a pattern on a surface of the substrate.

An aspect of the present invention is an apparatus for processing a substrate with electron beams. The apparatus includes rotation means for rotating a substrate support member for processing the substrate thereon and a signal generator means for generating a rotation clock signal from the axial rotation of the substrate. The apparatus includes a means for generating a corrected pattern clock signal from the axial rotation of the substrate and an electron beam generation means for processing the substrate with electron beams associated with the corrected pattern clock signal.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

As will be described below, aspects of one embodiment pertain to specific method steps implementable on computer systems. In one embodiment, the invention may be implemented as a computer program-product for use with a computer system. The programs defining the functions of at least one embodiment can be provided to a computer via a variety of computer-readable media (i.e., signal-bearing medium), which include but are not limited to, (i) information permanently stored on non-writable storage media (e.g. read-only memory devices within a computer such as read only CD-ROM disks readable by a CD-ROM or DVD drive; (ii) alterable information stored on a writable storage media (e.g. floppy disks within diskette drive or hard-disk drive); or (iii) information conveyed to a computer by communications medium, such as through a computer or telephone network, including wireless communication. The latter specifically includes information conveyed via the Internet. Such signal-bearing media, when carrying computer-readable instructions that direct the functions of the invention, represent alternative embodiments of the invention. It may also be noted that portions of the product program may be developed and implemented independently, but when combined together are embodiments of the invention.

Figure 1:
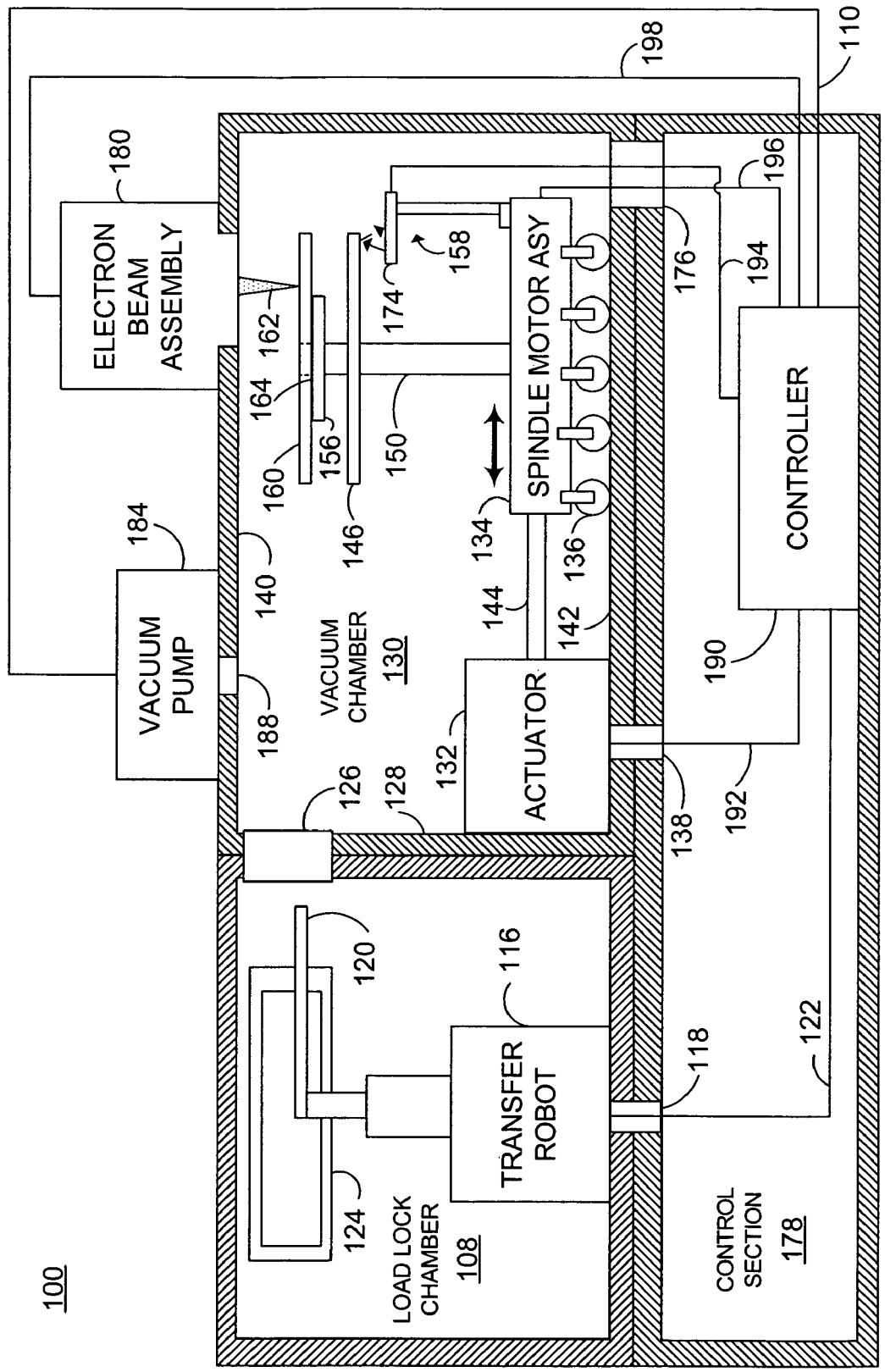
FIG. 1 is a high-level illustration of one embodiment of an electron beam substrate processing system in accordance with aspects of the invention.

FIG. 1 is a high-level illustration of one embodiment of an electron beam substrate processing system 100 in accordance with aspects of the invention. Electron beam substrate processing system 100 includes load lock chamber 108 and vacuum chamber 130. Vacuum chamber 130 is defined by sidewalls 128, top 140, and bottom 142. Load lock chamber 108 is in communication with vacuum chamber 130 via valve 126 disposed therebetween. Valve 126 may be configured to provide a vacuum seal between load lock chamber 108 and vacuum chamber 130. Valve 126 may be virtually any valve type, such as a slot valve, configured to allow substrates 160 to pass therethough. Electron beam substrate processing system 100 includes electron beam assembly 180 disposed on vacuum chamber 130 and positioned thereon in processing communication with substrate 160 disposed therein for processing with one or more electron beams 162. In one aspect, load lock chamber 108 and vacuum chamber 130 are disposed on control section 178 configured to supply control signals, power, etc., to electron beam substrate processing system 100. Vacuum chamber 130, load lock chamber 108, and control section 178 may be formed of rigid metal materials such as aluminum, steel, and the like, configured to accommodate a plurality of substrate processes. To maintain a desired vacuum, vacuum chamber 130 is coupled to vacuum pump 184 through valve 188. Control section 178 includes substrate process controller 190 configured to control at least some of the substrate processing operations described herein. Vacuum pump 184 may be controlled by substrate process controller 190 via signal 110.

For purposes of clarity, electron beam substrate processing system 100 is described in terms of utilizing a vacuum environment in which to process a substrate. However, it is contemplated that electron beam substrate processing system 100 may use a non-vacuum system whereby substrate 160 is processed in an atmospheric environment. For example, electron beam assembly 180 may be placed in proximity to substrate 160 rotating at atmospheric pressure such that the gap formed therebetween is sized to allow electrons to travel therethrough.

Load lock chamber 108 includes transfer robot 116 configured to move substrates 160 to and from vacuum chamber 130 through valve 126 for processing using transfer arm 120. Transfer robot may be controlled by substrate process controller 190 via signal 122. To maintain a vacuum seal between load lock chamber 108 and control section 178, signal 122 may be coupled to transfer robot 116 through seal 118. In one aspect, load lock chamber 108 receives substrates 160 for processing through valve 124.

Electron beam substrate processing system 100 includes spindle motor assembly 134 movably disposed within vacuum chamber 130. In one aspect of the present invention, spindle motor assembly 134 is disposed on transport assembly 136. Transport assembly 136 may include virtually any type of transport mechanism, such as wheels, rollers, bearings, gears, and the like, configured to assist the about horizontal motion of spindle motor assembly 134 along bottom 142 of vacuum chamber 130. Spindle motor assembly 134 is coupled to actuator 132 via arm 144. Actuator 132 may be one of a variety actuator types such as linear actuators, rotary actuators, and the like. In one aspect, actuator 132 is a linear actuator configured to move spindle motor assembly 134 with arm 144 in about a linear straight-line motion. In another aspect, actuator 132 is a rotary actuator configured to move spindle motor assembly 134 using arm 144 in about a horizontal angular motion about a rotational center of actuator 132. While spindle motor assembly 134 may be disposed on transport assembly 136 for support thereof, it is contemplated that in one configuration spindle motor assembly 134 does not use transport assembly 136 and therefore may be entirely supported by arm 144 above bottom 142.

Spindle motor assembly 136 includes spindle shaft 150 extending vertically therefrom toward a top 140 of vacuum chamber 130. Spindle shaft 150 is rotatably coupled on one end to spindle motor assembly 134 configured to axially rotate spindle shaft 150 at one or more rotational velocities. A substrate support member 156 is coupled on another end of spindle shaft 150 distal spindle motor assembly. 134. Substrate support member 156 may be virtually any type of substrate support such as an electronic chuck, mechanical clamp, and the like, configured to hold substrate 160 thereon for processing. Substrate support member 156 may be configured with support surface 164 configured to support substrate 160 thereon. Substrate support member 156 may be sized with virtually any diameter that may be used to advantage. For example, substrate support member 156 may be sized to about a similar diameter of substrate 160. Substrate support member 156 may be positioned in proximity to top 140 such that a surface portion of the substrate 160 may be aligned in proximity of electron beam 162 to form patterns thereon.

To determine rotational movements of the rotatable spindle shaft 150 and associated substrate rotational speed, encoder wheel 146 is positioned on the spindle shaft 150 about parallel to and in proximity of substrate support member 156 to rotate therewith. Encoder wheel 146 may be mounted to spindle shaft 150 using one or more methods as are known in the art. While, encoder wheel 146 may be configured in diameter about that of substrate 160, it is contemplated that the diameter of encoder wheel 146 may be of virtually any diameter that may be used to advantage.

An optical detector assembly 158 is disposed on and extends from spindle motor assembly 134. Optical detector 174 extends from optical detector assembly 158 in proximity to encoder wheel 146 to detect rotation markings thereon, some of which are described below with reference to FIG. 2. As encoder wheel 146 rotates with spindle shaft 150, such rotation markings are detected, translated into rotation signals by optical detector 174, and transmitted to substrate process controller 190 via rotation data signal 194.

In one operational configuration, substrate process controller 190 may be used to control an axial rotational speed of spindle shaft 150 and a position of spindle motor assembly 134 within vacuum chamber 130 to place one or more surface targets of substrate 160 within a desired proximity of electron beam output 162 for processing. Such targets may include a portion of the substrate surface with electron beam resist disposed thereon. Rotation data signal 194 may be processed by substrate process controller 190 to determine the time and position pattern to apply electron beam 162 to the substrate surface during processing. For example, substrate process controller 190 in response to rotation data signal 194, provides signal 196 to spindle motor assembly 134 to control the rotation of spindle shaft 150. Substrate process controller 190, in response to rotation data signal 194, provides control signal 198 configured to control a modulation of electron beam 162. For example, control signal 198 may be used to turn electron beam 162 on and off at desired times during substrate processing to form a desired pattern on a surface of substrate 160. To maintain a vacuum within vacuum chamber 130, signal 196 and rotation data signal 194 may be coupled to vacuum chamber 130 through seal 176.

Figure 2:
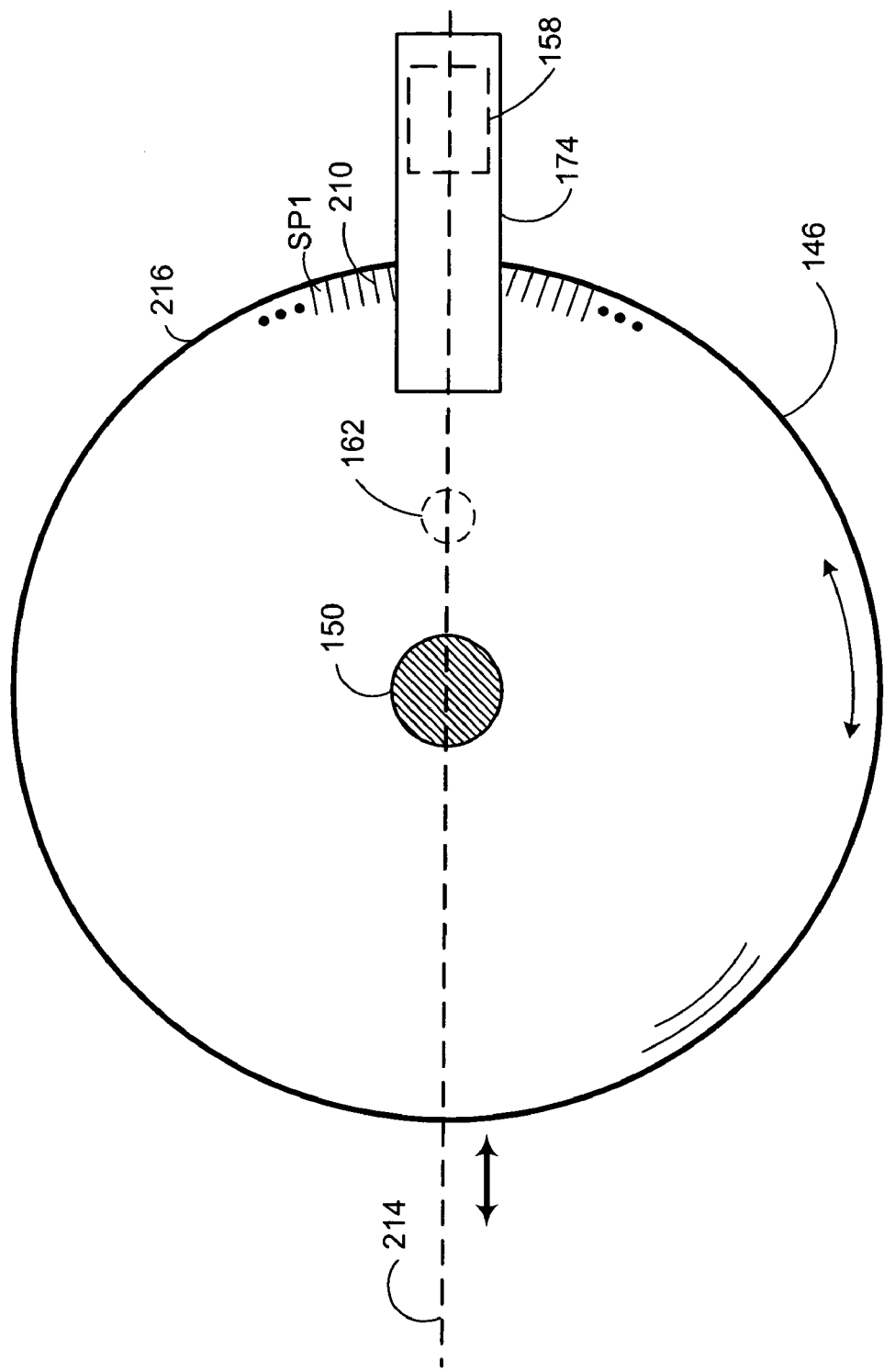
FIG. 2 is a high-level illustration of one embodiment of an encoder wheel of the electron beam substrate processing system of FIG. 1 in accordance with aspects of the invention.

FIG. 2 is a high-level illustration of one embodiment of an encoder wheel 146 of the electron beam substrate processing system 100 of FIG. 1 in accordance with aspects of the invention. Encoder wheel 146 includes a plurality of markings 210 (only some examples of which are illustrated in FIG. 2) generally disposed about an outer circumference of encoder wheel 146. To maximize the number of markings 210, markings 210 may be placed on an outer edge 216 i.e., outer circumference, of encoder wheel 146. Such markings 210 are detected by optical detector 174. For purposes of clarity, markings 210 shall be described in terms of an about equal spacing of SP1, however virtually any spacing configuration may be used to advantage. Spacing SP1 may be configured to suite a plurality of rotational speed control systems. For example, spacing SP1 may be configured to provide lower frequency rotation data signals 194 for those systems requiring lower frequency rotation data signal input. Thus, for such a case, markings 210 may be configured with spacing SP1 that is sized wider, e.g., markings 210 are further apart, to provide a lower number of markings 210 and therefore generate a lower frequency rotation data signal 194. In one aspect, to minimize angular aberrations during the electron beam writing process a center of optical encoder wheel 146 and optical detector 174 may be aligned along a longitudinal processing axis 214 parallel to the direction of movement of the substrate 160 relative electron beam 162 (See FIG. 1).

Figure 3:
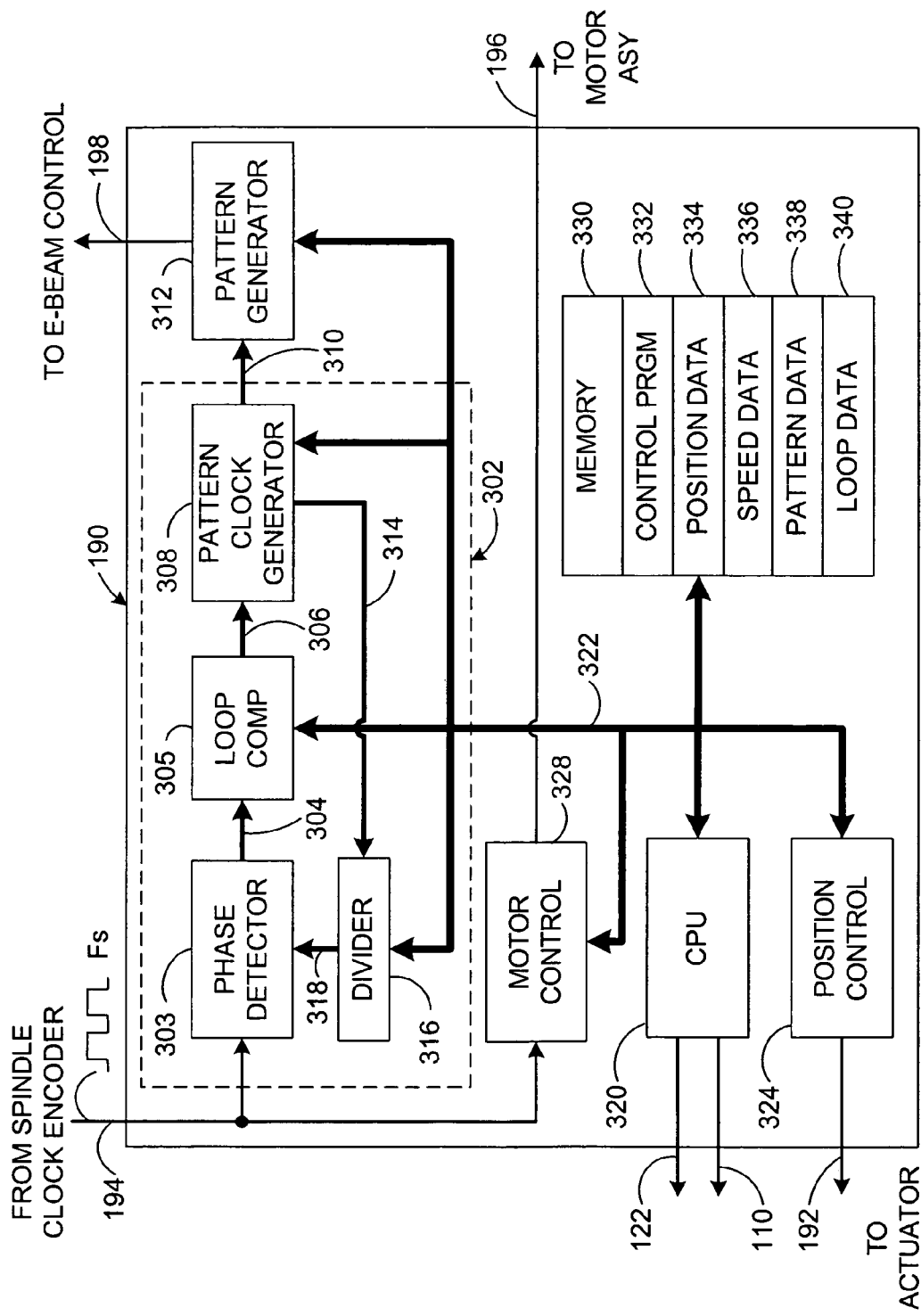
FIG. 3 is a high-level schematic of one embodiment of a substrate process controller of FIG. 1 in accordance with aspects of the invention

FIG. 3 is a high-level schematic of one embodiment of a substrate process controller 190 of FIG. 1 in accordance with aspects of the invention. In one aspect, substrate process controller 190 includes Central Processing Unit (CPU) 320 and memory 330. CPU 320 may be under the control of an operating system that may be disposed in memory 330. Virtually any operating system supporting the configuration functions disclosed herein may be used. Memory 330 is preferably a random access memory sufficiently large to hold the necessary programming and data structures of the invention. While memory 330 is shown as a single entity, it should be understood that memory 330 may in fact comprise a plurality of modules, and that memory 330 may exist at multiple levels, from high speed registers and caches to lower speed but larger direct random access memory (DRAM) chips.

Illustratively, memory 330 may include substrate process control program 332 that, when executed on CPU 320, controls at least some operations of electron beam substrate processing system 100. The substrate process control program 332 may use any one of a number of different programming languages. For example, the program code can be written in PLC code (e.g., ladder logic), a higher-level language such as C, C++, Java, or a number of other languages. While substrate process control program 332 may be a standalone program, it is contemplated that substrate process control program 332 may be combined with other programs.

In one aspect, memory 330 may include speed data 336. Speed data 336 may be processed by substrate process controller 190 to control spindle motor assembly 134 to establish one or more rotational speeds of spindle shaft 150. Speed data 336 may include predetermined rotation velocity data based on previous substrate processes. In another aspect of the present invention, memory 330 may include position data 334. Position data 334 may be used by substrate process controller 190 to horizontally position spindle motor assembly 134 within vacuum chamber 130. For example, position data 334 may be processed by CPU 320 to horizontally position spindle motor assembly 134 along longitudinal processing axis 214. Memory 330 may include pattern data 338. In one aspect, pattern data 338 may be derived by CPU 320 from rotation data signal 194 and position data 334. Such pattern data 338 may be used to determine one or more angular positions of substrate surface targets based on rotational speed of substrate 160 and radial position of electron beam 162 relative a center axis of substrate 160.

In one aspect, substrate process controller 190 includes motor control circuit. 328, pattern clock circuit 302, pattern generation circuit 312, and position control circuit 324. Motor control circuit 328, pattern generation circuit 312, pattern clock circuit 302, and position control circuit 324 may be electrically connected to CPU 320 via bus 322. CPU 320 may be used to control at least portion of motor control circuit 328, pattern generation circuit 312, pattern clock circuit 302, and position control circuit 324 described herein. For example, CPU 320 may configure spindle motor assembly 134 to rotate spindle shaft 150 at one or more desired rotational speeds in response to speed data 336. Further, CPU 320 may be used to operate pattern generation circuit 312 such that patterns stored in pattern data 338 are written on a surface of substrate 160. In addition, CPU 320 may be configured to position spindle motor assembly to one or more radial processing positions, e.g., processing tracks, in proximity of electron beam 162 by controlling actuator 132 via control signal 192 from position control circuit 324. To maintain a vacuum seal between vacuum chamber 130 and control section 178, signal 192 may be coupled to actuator 132 through seal 138.

Motor control circuit 328 may be configured to control one or more rotational velocities of spindle shaft 150 using a feedback loop process. Motor control circuit 328 provides signal 196 to spindle motor assembly 134 in response to rotation data signal 194 having frequency Fs. Such frequency Fs may be configured to maintain loop control of a rotational velocity of spindle shaft 150 over a range of rotational velocities. Motor control circuit 328 may be configured to adjust rotational velocity of spindle shaft 150 to a constant angular velocity to process substrates 160 used to produce media associated with consent angular velocity modes such as magnetic disk drives, and the like. For example, motor control circuit 328 may be configured to process rotation data signal 194 to maintain rotation speed of spindle shaft 150 within a range of a desired spindle shaft rotational speed such as may be found in speed data 336. Motor control circuit 328 may be configured to adjust rotational speed of spindle shaft 150 to one or more non-constant rotational velocities for processing optical media used in variable angular velocity modes such as CDs, DVDs, and the like. For example, motor control circuit 328 may be controlled by substrate process controller 190 to vary the rotational speed of spindle shaft 150 as a function of substrate radius, e.g., track position. For optical media such as CDs, a given target size (data spot) may be about the same size at a constant frequency of control signal 198 described below. Thus, to write more data at an inner radius of the substrate, substrate process controller 190 may be configured to change rotational speed of spindle shaft 150 as needed during substrate processing, e.g., recording.

In one aspect of the present invention, pattern clock circuit 302 is configured to provide pattern clock signal 310 to pattern generation circuit 312 in response to rotation data signal 194. Pattern clock circuit 302 includes phase detector 303, loop compensation circuit 305, pattern clock generator 308, and divider 316. Phase detector 303, loop compensation circuit 305, pattern clock generator 308, and divider 316 form a phase lock loop circuit (PLL) configured to phase lock an output signal 314 of pattern clock generator 308 to rotation data signal 194. Phase detector 303 outputs loop error signal 304 in response to a phase comparison between a signal 318 from divider 316 and rotation data signal 194. Loop compensation circuit 305 provides bandwidth control for pattern clock circuit 302. To maintain loop control over a plurality of rotational velocities, loop compensation circuit 305 may be dynamically configured to a desired range of phase lock loop response bandwidths some of which may be found in loop control data structure 340. For example, CPU 320 may be configured to provide phase lock loop response bandwidth control signals from loop data structure 340 to loop compensation circuit 305 via bus 322 as needed. Loop compensation circuit 305 may include filtering circuits, such as, digital filtering circuits, and the like, configured to filter loop error signal 304. In one configuration, loop compensation circuit 305 processes loop error signal 304 to provide signal 306 to pattern clock generator 308. Pattern clock generator 308 outputs signal 314 to divider 316 in response to signal 306. Divider 316 may be configured to divide an output signal 314, configured to one or more multiples of a frequency Fs of rotation data signal 194, to frequency Fs. Divider 316 may be virtually any divider such as a, flip-flop divider configuration, divide-by-n, and the like, that may be used to advantage. In one aspect, signal 314 and pattern clock signal 310 have the same frequency wherein divider 316 is configured to divide such a frequency 314 to provide signal 318 at frequency Fs to another input of phase detector 303. In one embodiment, to increase a pattern writing resolution of electron beam assembly 180, pattern clock signal 310 may be configured with a greater frequency relative a frequency Fs of rotation data signal 194 but still be phase locked thereto. For example, rotation data signal 194 may have a frequency Fs of 1 kHz while pattern clock signal 310 may be configured to 10 KHz and phase locked to rotation data signal 194.

Pattern generation circuit 312 controls at least some of the operations of electron beam assembly 180 to generate an electron-beam processing pattern. For example, pattern generation circuit 312 may process pattern clock signal 310 to determine processing times to activate or deactivate a blanking operation of electron beam assembly 180 based on one or more rotational speeds of the substrate 160 and a position of the electron beam 162 relative one or more target processing areas of substrate 160. In one aspect, pattern generation circuit 312 outputs control signal 198 responsive to pattern clock signal 310. Such control signal 198 may be used to modulate electron beam 162 on and off to process substrate 160. Control signal 198 may also be used to control the power level of electron beam 162 to a desired processing exposure power. In one configuration, pattern data 338 is provided to pattern generation circuit 312 via bus 322. Such pattern data 338 may be used with control signal 198 to write one or more patterns on at least some portion of the surface of substrate 160 exposed to electron beam 162.

In one operational embodiment, spindle shaft 150 rotates encoder wheel 146 and substrate 160. As described herein, optical detector 174 provides rotation data signal 194 associated with the rotation of encoder wheel 146 to substrate process controller 190. Motor control circuit 328 receives and processes rotation data signal 194 and outputs signal 196 to spindle motor assembly 134 to control one or more rotational speeds of spindle shaft 150. CPU 320 determines processing patterns associated with substrate rotation speeds and positional placement of each substrate target to position electron beam 162 thereon. Such processing patterns may be stored in memory 330 as pattern data 338 and may be sent to pattern generation circuit 312 for processing thereof via bus 322. Pattern clock circuit 302 generates pattern clock signal 310 in response to rotation data signal 194. CPU 320 controls pattern generation circuit 312 to process pattern clock signal 310. Pattern generation circuit 312 outputs control signal 198 to electron beam assembly 180 for control of electron beam 162 in response to pattern clock signal 310 and pattern data 338. Therefore, during processing as substrate 160 is rotated, rotation speed of substrate 160 is controlled using rotation data signal 194 and electron beam 162 is turned on and off in accordance to pattern data 338 clocked by pattern clock signal 310.

In one aspect, pattern clock circuit 302 detects repeatable aberrations, e.g., repeatable deviations, of loop error signal 304 associated with repeatable rotational velocity irregularities of spindle shaft 150. Such detected repeatable aberrations of loop error signal 304 may be stored into memory 330, such as speed data 340, and used by pattern clock generator 308 to provide a corrected version of pattern clock signal 310 to pattern generation circuit 312 for processing thereof. For example, at least some repeatable rotational velocity aberrations of spindle shaft 150 may be stored in memory 330 as velocity aberration data. Such stored velocity aberration data may be processed by pattern clock generator 308 to generate a corrected version of pattern clock signal 310. Such corrected version of pattern clock signal 310 may be processed by pattern generation circuit 312 to correct for such repeatable velocity aberrations during substrate processing as described further below.

Figure 4:
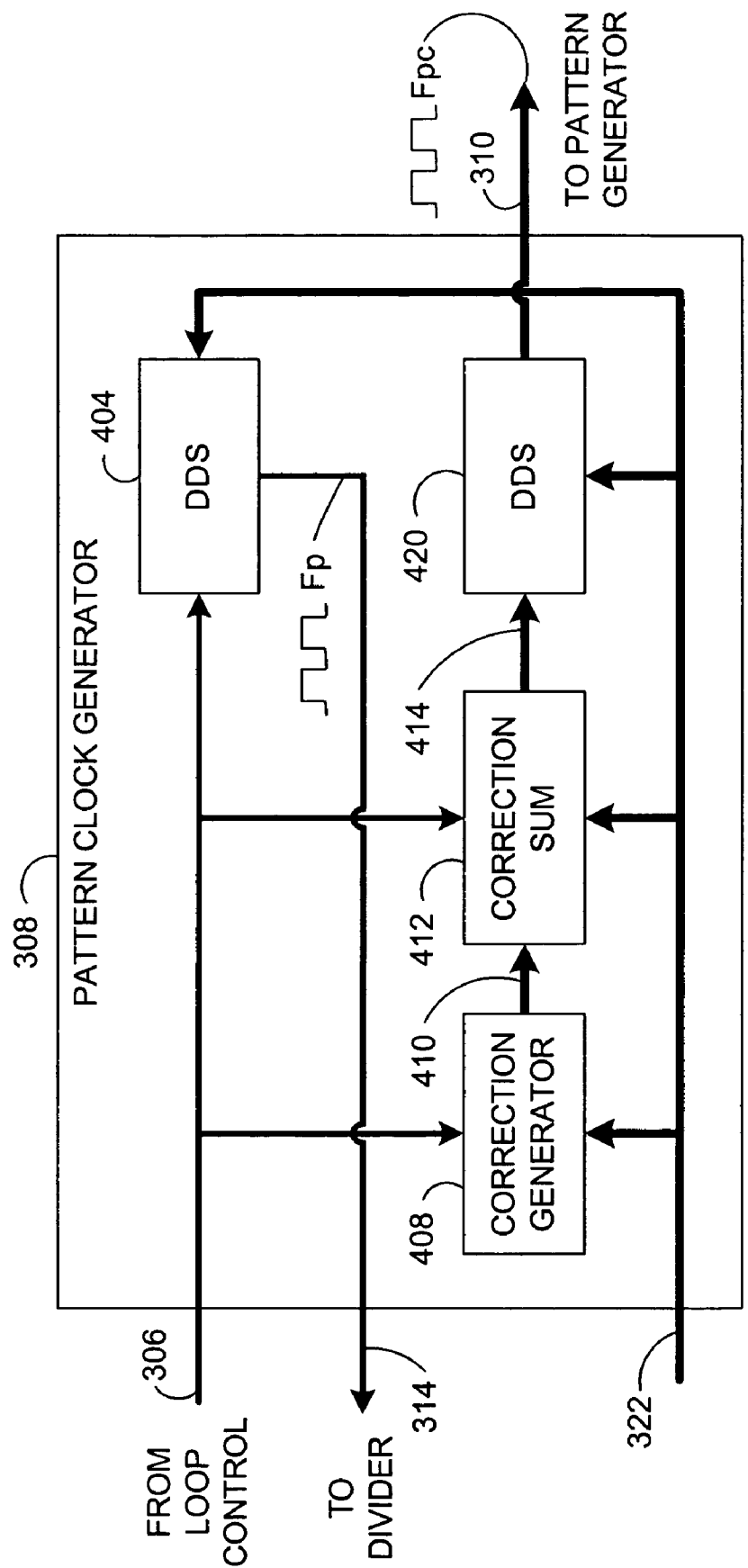
FIG. 4 is a high-level schematic of one embodiment of a pattern clock generator in accordance with aspects of the invention.

FIG. 4 is a high-level schematic of one embodiment of a pattern clock generator 308 in accordance with aspects of the invention. For purposes of clarity, pattern clock generator 308 is described in terms of digital signals, however it is contemplated that pattern clock generator 308 may be configured to use digital and analog signals. In one aspect of the present invention, pattern clock generator 308 includes DDS 404, correction data circuit 408, summation circuit 412, and DDS 420. DDS 404 provides signal 314 to divider 316 (See FIG. 3) in response to signal 306. Correction data circuit 408 provides repeatable correction signal 410 to summation circuit 412 in response to signal 306. Summation circuit 412 provides correction signal 414 to DDS 420 in response to the summation of repeatable correction signal 410 and signal 306. In one aspect, a correction signal 414 may be described in terms of equation 1, as follows:

$$\text{Correction Signal} = \text{Repeatable Correction Signals} + \text{Random Signals} \quad (1)$$

Where correction signal 414 equals the sum of one or more repeatable correction signals 410 and random signals, e.g., random and non-repeatable fluctuations in signal 306. DDS 420 processes correction signal 414 and provides a corrected version of pattern clock signal 310 to pattern generation circuit 312.

In one configuration, signal 306 includes digital signals, i.e., digital words. DDS 404 may be configured to output signal 314 at a frequency Fp in response to such a digital signal. A plurality of digital signal data may be stored in correction data circuit 408 and memory 430. Each one of a plurality of digital signal data may be associated with an angular position, e.g., count value of timing marks 210, of the rotating spindle shaft 150. For example, motor control circuit 328 may count and output such angular position data to CPU 320 associated with rotation data signal 194. Such angular position data may be used to associate one or more digital signal data with rotational positions of spindle shaft 150. Consider the case where encoder wheel 146 has 360 equally spaced marks 210, a count of one may be indicative of a first angular position, e.g., zero degrees, while a count of "359" may be indicative of an ending angular position, e.g., "359 degrees". During operation, correction data circuit 408 outputs a repeatable correction signal 410 in digital form, associated with a particular rotational position, e.g., count value, to summation circuit 412. Summation circuit 412 adds repeatable correction signal 410 and signal 306 together to provide a digital summation thereof as a digital correction signal 414 to DDS 420. DDS 420 outputs a digital corrected pattern clock signal 310 at a frequency of Fpc to pattern generation circuit 312.

In one operational aspect, before writing a pattern on a substrate 160, spindle shaft 150 is rotated and a plurality of digital signals associated with rotational velocity and repeatable divergences therefrom are stored in correction data circuit 408 and memory 330. At least some of a plurality of digital signals are associated with a respective rotational position of the rotating spindle shaft 150 and stored in correction data circuit 408. During an electron beam writing process, correction data circuit 408, e.g., correction data generator, outputs correction signal 414 in response to such stored digital signal data. As random, i.e., non-repeatable velocity aberrations may occur during processing, summation circuit 412 determines at least some differences between stored velocity aberration data and other velocity aberration data from signal 306 and generates correction signal 414 therefrom. Thus, in this configuration, pattern clock generator 308 stores and corrects for repeatable aberrations at one or more angular positions of spindle shaft 150 as it is axially rotated, and provides immediate, e.g., on the fly, adjustments to corrected pattern clock signal 310 to accommodate for at least some other random rotational velocity aberrations as they occur.

Figure 5:
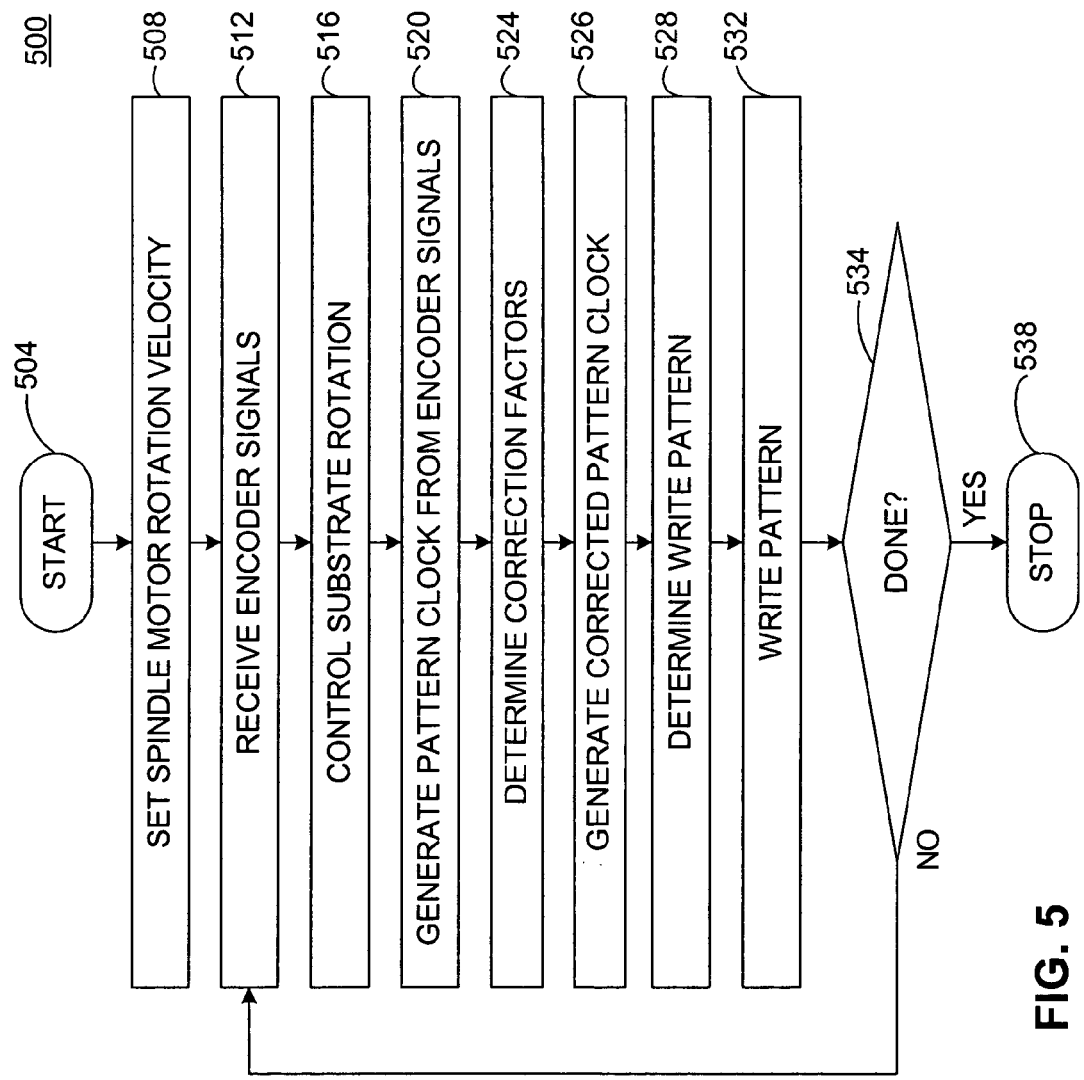
FIG. 5 is a high-level flow diagram of one embodiment of a method of processing a substrate with an electron beam processing system of FIG. 1 in accordance with aspects of the invention.

FIG. 5 is a high-level flow diagram of one embodiment of a method 500 of processing a substrate with an electron beam processing system 100 of FIG. 1 in accordance with aspects of the invention. Method 500 is entered in to at 504, for example, when substrate process control program 332 is activated. At 508, at least one rotational velocity of spindle shaft 150 of spindle motor assembly is established. At 512, at least some encoder data signals, such as rotation data signal 194, associated with such a rotational velocity are processed to determine a rotation speed of spindle shaft 150. At 516, rotation of spindle shaft 150 is controlled within a desired range of rotational velocity using at least some encoder data signals. Encoder data signals are processed to generate pattern clock signal 310 at 520. At 524, such encoder data signals are processed to determine at least some repeatable aberration data associated with rotational velocity of spindle shaft 150 after one or more rotations. At least some repeatable aberration data and other aberration data are processed to generate a corrected version of pattern clock signal 310 at 526. At 528, a writing pattern for a substrate is determined. For example, such a writing pattern may be derived from pattern data 338. At 532, such a writing pattern is written on a substrate surface in accordance to timing of corrected pattern clock signal 310. If at 534, method 500 is not finished method 500 proceeds to 512. However, if at 534, method 500 is finished, method 500 proceeds to 538 and ends.

While the foregoing is directed to embodiments of the invention, other and further embodiments of the invention may be devised without departing from the basic scope thereof. The scope of the invention is determined by the claims that follow and equivalents.

What is claimed is:

1. An electron beam substrate processing apparatus, comprising:
    a substrate processing chamber defined by sidewalls, a bottom, and a top;
    a spindle motor assembly moveably disposed within the substrate processing chamber;
    a spindle shaft extending from the spindle motor assembly toward the top;
    a substrate support member mounted to an end of the spindle shaft distal the spindle motor assembly;
    an encoder wheel coupled to the spindle shaft and positioned adjacent the substrate support member;
    an optical detector positioned in optical communication with the encoder wheel, the optical detector being configured to output rotation data signals in response to detected rotation of the encoder wheel;
    a controller configured to output corrected pattern clock signals in response to the rotation data signals; and
    an electron beam assembly attached to the substrate processing chamber and configured to direct an electron beam onto a surface of the substrate for processing.

2. The apparatus of claim 1, further comprising an actuator coupled to the spindle motor assembly and configured to move the spindle motor assembly in a horizontal motion relative a longitudinal axis of the spindle shaft.

3. The apparatus of claim 1, further comprising a vacuum pump coupled to the substrate processing chamber to provide a vacuum therein.

4. The apparatus of claim 1, wherein the controller comprises a motor speed control circuit configured to process at least some of the rotation data signals to control the rotational motion of the spindle shaft.

5. The apparatus of claim 1, wherein the controller comprises a data signal processing circuit configured to process at least some of the rotation data signals and output the corrected pattern data signals in response thereto to the electron beam assembly for control thereof.

6. A method of processing substrates with an electron beam processing system, comprising:
    rotating a substrate support member configured to hold the substrate thereon for processing;
    generating rotation data signals from an encoder assembly associated with a rotational movement of the substrate support member;
    generating corrected pattern clock signals from the rotation data signals associated with the rotational movement of the substrate support member; and
    processing at least some of the corrected pattern clock signals to generate a corrected electron beam processing pattern for writing a pattern on a surface of the substrate.

7. The method of claim 6, wherein the generating rotation data signals comprises optically detecting the rotational movements of an encoder wheel in axial alignment with and adjacent the rotating substrate support member.

8. The method of claim 6, further comprises processing at least some of the rotation data signals with a motor control circuit configured to maintain one or more desired rotational speeds of the substrate support member.

9. The method of claim 6, wherein a frequency of the pattern clock signals is greater than a frequency of the rotation data signals.

10. The method of claim 6, wherein the generating corrected pattern clock signals comprises determining one or more shaft rotation deviations associated with the rotation data signals.

11. The method of claim 10, wherein the determining one or more shaft rotation deviations comprises detecting the deviations from the rotation data signals.

12. The method of claim 11, wherein the processing at least some of the corrected pattern clock signals to generate the corrected pattern data signal comprises processing at least some of the deviations detected to generate the corrected pattern clock signals.

13. An apparatus for processing a substrate with electron beams, comprising:
    rotation means for rotating a substrate support member for processing the substrate thereon;
    signal generator means for generating a rotation clock signal from the axial rotation of the substrate;
    means for generating a corrected pattern clock signal from the axial rotation of the substrate; and
    an electron beam generation means for processing the substrate with electron beams associated with the corrected pattern clock signal.

14. The apparatus of claim 13, further comprising processor means for processing the corrected pattern clock signal to generate a corrected substrate process pattern therefrom.

15. The apparatus of claim 13, wherein the rotation means comprises a movable spindle motor assembly having a spindle shaft extending therefrom coupled on one end to the substrate support member.

16. The apparatus of claim 15, wherein the signal generator means comprises at least one encoder wheel positioned on the spindle shaft parallel to and adjacent a substrate support member configured to support the substrate thereon for processing.

17. The apparatus of claim 15, wherein the signal generator means comprises a means for detecting timing marks on the at least one encoder wheel to generate the rotation clock signal.

18. The apparatus of claim 15, wherein the means for generating a corrected pattern clock signal comprises a deviation detector means for detecting at least one aberration associated with the axial rotational velocity of the substrate.

19. The apparatus of claim 18, wherein the deviation detector means comprises a phase locked loop configured to output the corrected pattern clock signal.

20. The apparatus of claim 19, wherein the phase locked loop comprises an oscillator circuit configured to maintain lock with the rotation clock signal and another oscillator circuit configured to receive a corrected version of the rotation clock signal and generate the corrected pattern clock signal therefrom.

* * * * *